United States Patent
Okushi et al.

(10) Patent No.: US 6,815,721 B2
(45) Date of Patent: Nov. 9, 2004

(54) DIAMOND SEMICONDUCTOR AND DIAMOND SEMICONDUCTOR LIGHT-EMITTING DEVICE THAT USES THE SEMICONDUCTOR

(75) Inventors: Hideyo Okushi, Tsukuba (JP); Hideyuki Watanabe, Tsukuba (JP); Daisuke Takeuchi, Tsukuba (JP); Koji Kajimura, Tsukuba (JP)

(73) Assignee: Agency of Industrial Science & Technology, Ministry of International Trade & Industry, Tokyo (JP)

( * ) Notice: Subject to any disclaimer, the term of this patent is extended or adjusted under 35 U.S.C. 154(b) by 0 days.

(21) Appl. No.: 10/793,798

(22) Filed: Mar. 8, 2004

(65) Prior Publication Data

US 2004/0169178 A1 Sep. 2, 2004

Related U.S. Application Data (62) Division of application No. 09/731,789, filed on Dec. 8, 2000.

(30) Foreign Application Priority Data

Mar. 28, 2000 (JP) ........................................ 2000-089516

(51) Int. Cl.[7] ............................................ H01L 31/0312
(52) U.S. Cl. ........................................... 257/77; 257/86
(58) Field of Search ........................... 257/77, 86, 104, 257/655–656

(56) References Cited

U.S. PATENT DOCUMENTS 5,420,879 A * 5/1995 Kawarada et al. ............ 372/41
5,600,156 A * 2/1997 Nishibayashi et al. ........ 257/77

FOREIGN PATENT DOCUMENTS

JP 07-307487 * 11/1995

* cited by examiner

*Primary Examiner*—Phat X. Cao
*Assistant Examiner*—Theresa T. Doan
(74) *Attorney, Agent, or Firm*—Oblon, Spivak, McClelland, Maier & Neustadt, P.C.

(57) ABSTRACT

A diamond semiconductor has an exciton light-emission intensity characteristic that varies nonlinearly.

4 Claims, 8 Drawing Sheets

DIAMOND SEMICONDUCTOR AND DIAMOND SEMICONDUCTOR LIGHT-EMITTING DEVICE THAT USES THE SEMICONDUCTOR

This application is a divisional of U.S. application Ser. No. 09/731,789, filed Dec. 8, 2000.

BACKGROUND OF THE INVENTION

1. Field of the Invention

This invention relates to a diamond semiconductor expected to be developed as a light-emitting device and to a diamond semiconductor light-emitting device that uses the semiconductor.

2. Description of the Prior Art

In view of its superior semiconductor and optical characteristics as well as its mechanical, chemical and thermal characteristics, diamond is receiving much attention as a potential material for electronic devices and also for light-emitting devices. In addition to its superior performance and high functionality, diamond can be used under severe conditions under which conventional materials could not be used, and it is receiving much attention for this reason as well.

Particularly in its use as a material for light-emitting devices, diamond is known to have a wide band gap of 5.5 eV and to demonstrate many light-emission centers in this band gap due to various impurity atoms. Therefore, diamond can be applied to light-emitting devices or laser devices that use these light-emission centers in the range from visible light to ultraviolet light. Laser oscillation that utilizes these light-emission centers has actually been confirmed.

Diamond is an indirect transition semiconductor, but it has a characteristic that allows the observation of the light-emission process at room temperature due to a material-specific electronic state referred to as an exciton and not the extrinsic light-emission center of an impurity atom, etc. This light emission due to an exciton is a 235-nm ultraviolet light at room temperature.

Assuming that diamond has the nonlinear optical characteristic in this light-emission process due to excitons that is required for a laser oscillation condition, diamond light-emitting or laser devices that utilize this should be feasible, but though there have been reports of ultraviolet light emission due to excitons in diamond, there have been no findings of nonlinearity to date.

Researches and developments for laser devices have been attempted using various single solid materials in the ultraviolet band in order to realize ultrahigh capacity light memory, but none have been realized to date. Though a number of ultraviolet light-emitting devices that utilize diamond have been proposed, why none has been realized is because of the lack of a viable crystal growth technology for diamond which has the nonlinear characteristic that is key to realizing a light-emitting device.

This invention is proposed as an attempt to the above, and one object thereof is to provide a diamond semiconductor and a diamond semiconductor light-emitting device capable of actually realizing a light-emitting device or laser device by effectively utilizing diamond as an ultraviolet light-emitting material.

SUMMARY OF THE INVENTION

To achieve the above object, the diamond semiconductor of this invention has an exciton light intensity characteristic that varies nonlinearly.

The aforementioned diamond semiconductor includes a diamond thin film of high quality sufficient to emit ultraviolet light at room temperature with energy injection.

The diamond semiconductor light-emitting device of this invention comprises an n-type diamond semiconductor layer, a p-type diamond semiconductor layer, and a high-quality undoped diamond semiconductor layer between the n-type diamond semiconductor layer and the p-type diamond semiconductor layer, wherein an exciton light emission that varies nonlinearly is output from the undoped diamond semiconductor layer when current is injected into electrodes in direct contact with or formed indirectly on the n-type and p-type diamond semiconductor layers.

Further, the diamond semiconductor light-emitting device of this invention comprises a high-quality n-type diamond semiconductor layer, a high-quality p-type diamond semiconductor layer formed on and in contact with the n-type diamond semiconductor layer, and an activation region layer formed in the interface between the n-type and p-type diamond semiconductor layers, wherein an exciton light emission that varies nonlinearly is output from the activation region layer when current is injected into electrodes in direct contact with or formed indirectly on the n-type and p-type diamond semiconductor layers.

As described above, the diamond semiconductor of this invention demonstrates an exciton light-emission intensity characteristic that varies nonlinearly, and therefore it is able to emit ultraviolet light extremely efficiently. Further, since this invention uses a diamond semiconductor with high quality sufficient to emit ultraviolet light at room temperature with energy injection, the threshold of the nonlinear optical characteristic can be made low depending on the level of high quality. Thus, it is possible to emit ultraviolet light with even greater efficiency.

The diamond semiconductor light-emitting device of this invention uses a high-quality undoped diamond semiconductor layer between the n-type and p-type diamond semiconductor layers, and therefore the intensity of the ultraviolet light increases nonlinearly and exponentially as the current is increased, thus facilitating the configuration of an extremely efficient light-emitting device.

Furthermore, since both the n-type and p-type diamond semiconductor layers of the diamond semiconductor light-emitting device of this invention are of high quality and also since the n-type and p-type diamond semiconductor layers are brought in contact, an activation region is formed between the two. Therefore, the intensity of the ultraviolet light also increases nonlinearly and exponentially as the current is increased, thus facilitating the configuration of an extremely efficient light-emitting device.

The above and other objects and other features of this invention are explained clearly below based on the attached drawings.

DESCRIPTION OF THE PREFERRED EMBODIMENTS

Figure 1:
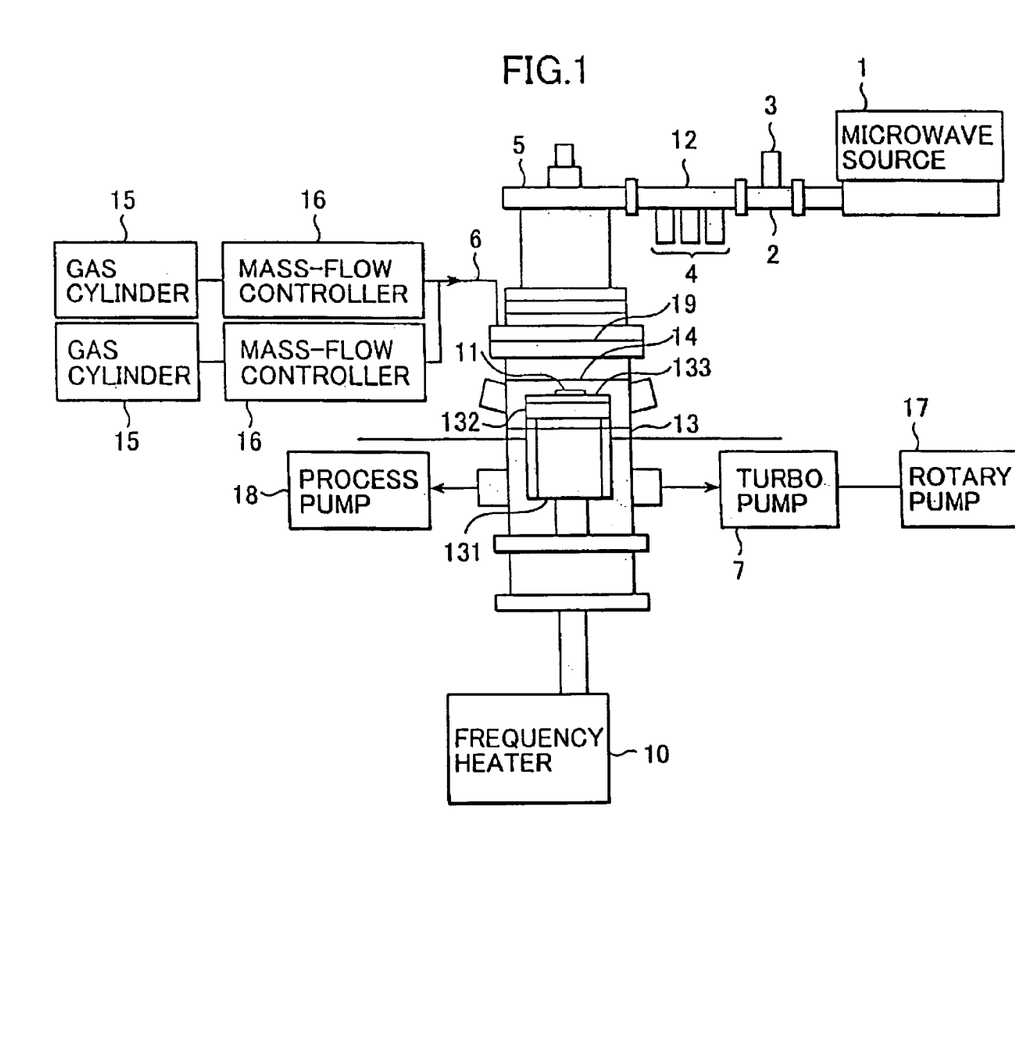
FIG. 1 is a schematic diagram of the microwave plasma CVD apparatus used in the fabrication of the diamond semiconductor of this invention.

FIG. 1 is a schematic diagram showing the configuration of a microwave plasma CVD apparatus 100 used in the fabrication of the diamond semiconductor of this invention. In the figure, the microwave plasma CVD apparatus 100 is of an end-launch type in which the microwaves enter a substrate 11 from the normal direction, a microwave source 1 generates 2.45 GHz microwaves and has a maximum output of 1.5 kW, and its output can be adjusted as required. On the downstream side of the microwave source 1, a circulator 2 and a dummy load 3 are provided. As a result, the reflected waves of the microwaves emitted from the microwave source 1 that are reflected and return back to a wave guide 12 are heat-absorbed as a water load to prevent the reflected waves from having any adverse effects on the oscillator of the microwave source 1. Further, a turner 4 is disposed on the downstream side of the circulator 2 to allow adjustment of the impedance of the wave guide 12 using three rods in order to suppress the reflection of microwaves so that all injected power is consumed in the plasma. Further, the downstream side of the tuner 4 is equipped with an applicator 5 that has an antenna protruding into the wave guide 12 which converts the TE10 mode microwaves propagated through the wave guide 12 to concentric TN01 mode microwaves. Converting the microwaves to TM01 mode matches them to a cylindrical reactor 13 so that a stable plasma can be obtained.

The source gas is a mixed gas comprising methane gas as the carbon source, hydrogen gas, and an impurity doping gas, which is supplied as required. These gases are led to the reactor 13 from their respective gas cylinders 15 through reducing valves (not shown), mass-flow controllers 16 and a gas injection pipe 6. The gas injection pipe 6 causes the gases to be directed into the reactor 13 as a gas shower from a shower head 19 disposed on top of the reactor 13. The mass-flow controller 16 for the methane gas is of a high-precision type to ensure a mixing ratio of less than 0.5% (ratio of methane gas to hydrogen gas).

A process pump 18 is used to exhaust gas during the CVD diamond synthesis process in order to control the gas pressure in the reactor 13 and promote diamond synthesis by plasma CVD. A turbo pump 7 is used to achieve a high vacuum in advance, after which a rotary pump 17 is used to exhaust during synthesis, and a high-frequency heater 10 is used to control the temperature of the substrate 11. A sample replacement door 14 is opened and the substrate 11 is set in a prescribed location. That is, inside the reactor 13, a susceptor 132 made from graphite is provided on a stage 131, and the substrate 11 is placed on a substrate holder 133 disposed on the susceptor 132.

The diamond thin-film layer was fabricated in the above microwave plasma CVD apparatus with a low concentration of methane gas, and the film quality of the fabricated diamond thin-film layer was evaluated using a scanning electron microscope (SEM) modified to measure cathode luminescence (CL).

Figure 2:
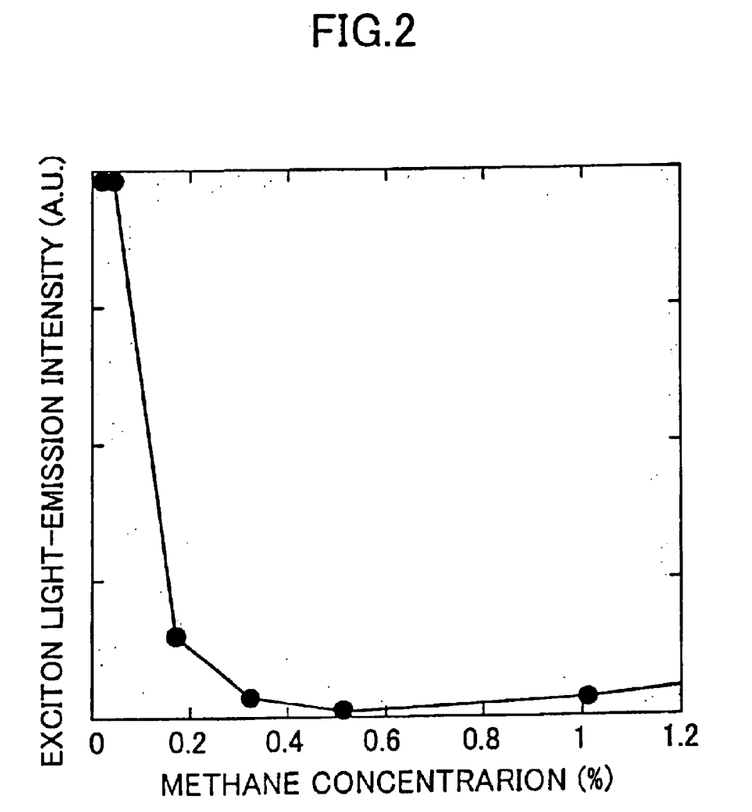
FIG. 2 is a graph showing the intensity of ultraviolet light emission from a diamond thin-film layer fabricated by varying the methane gas concentration.

FIG. 2 shows the intensity of ultraviolet light emission from a diamond thin-film layer fabricated by varying the methane gas concentration between 0.016% and 1.0%. In the figure, the horizontal axis stands for the methane concentration and the vertical axis for the exciton light-emission intensity per unit volume. In FIG. 2, when the methane gas concentration was made extremely low, e.g., 0.025% and 0.016%, during fabrication, the ultraviolet light emission increased greatly.

The diamond thin-film layers both demonstrate a CL intensity at a wavelength of 235 nm at room temperature. The light emission at this 235 nm wavelength is 5.27 eV ultraviolet luminescence resulting from free exciton recombination of the diamond. A diamond thin-film layer fabricated using an extremely low methane gas concentration demonstrates a marked exciton light emission specific to diamond at room temperature. Diamond thin-film layers fabricated at low methane gas concentrations, e.g., 0.5%, 1.0% and 2.0%, however, contain impurities or defects in the film, resulting in the appearance of recombination centers which interfere with light emission in the band gap. Though they may demonstrate band-edge luminescence specific to diamond at room temperature, they do not exhibit so marked band-edge luminescence as that from the diamond thin-film layer fabricated at a methane as concentration of 0.016%.

In view of this finding, it can be seen from FIG. 2 that a diamond thin-film layer fabricated in a gas methane concentration ranging from an extremely low 0.016% to a low 1.0/o is a good quality (high quality) thin-film layer. There have been reports of band-edge luminescence from this kind of diamond thin film at temperatures below that of liquid nitrogen, but the group of the present inventors is the first to observe it at room temperature.

The luminescence at room temperature in this case appears in response to the injection of an electron beam in a cathode luminescence measurement device. However, we can expect to confirm luminescence in response to current injection, x-ray injection, ion injection and the injection of other types of energy other than an electron beam.

The diamond thin-film layer used in this embodiment is of high quality sufficient to emit ultraviolet light at room temperature in response to the injection of energy as described above.

In this embodiment, the aforementioned microwave plasma CVD apparatus 100 was used to fabricate two types of diamond thin film using methane gas concentrations of 0.025% and 0.5%. Further, the aforementioned cathode luminescence measuring apparatus was used to inject an electron beam into each of the two types of diamond thin-film layer and measure the light-emission intensity. The measurement results are explained based on FIG. 3.

Figure 3:
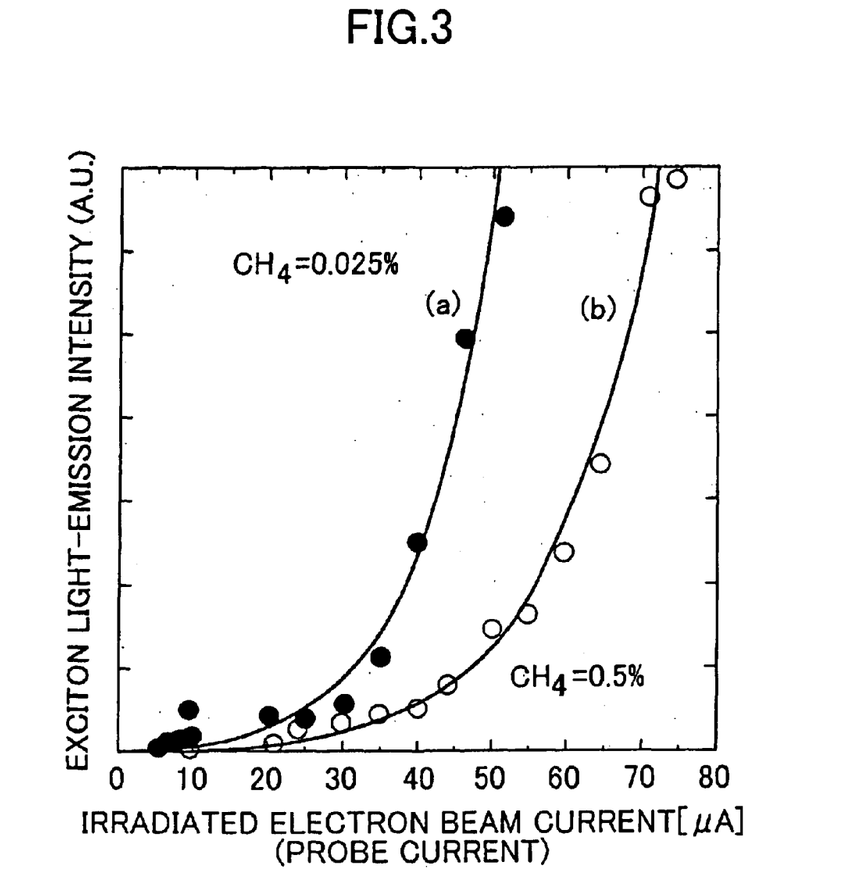
FIG. 3 is a graph showing the light-emission intensity characteristic of the diamond thin-film layer shown in FIG. 2.

FIG. 3 is a graph showing the light-emission intensity characteristic of the diamond thin-film layer described above. In the figure, the horizontal axis stands for the current value (probe current value) of the electron beam irradiated on the diamond thin-film layer (sample), and the vertical axis for the exciton light-emission intensity. In the figure, (a) represents a sample fabricated using a 0.025% methane gas concentration, and (b) represents a sample fabricated using a 0.5% methane gas concentration. Measurement was performed while holding the sample temperature at 300 K and with an electron beam acceleration voltage of 30 kV. The probe current was measured using a Faraday cup placed in close proximity to the sample. The light-emission intensity was established by fitting the free exciton light-emission peak at 235 nm (5.27 eV) using a Gaussian function. The substrate used to fabricate these samples did not demonstrate any exciton light emission.

As shown in FIG. 3, the diamond thin-film layer of this invention demonstrates an exciton light-emission intensity that varies nonlinearly according to the strength of the electron beam by which it is irradiated. That is, the light-emission intensity was observed to increase proportionally to the probe current and to increase exponentially when the probe current reached a certain value. The experimental result for this sudden increase in intensity in response to the probe current fits the method of least squares, with the threshold value for sample (a) being about 30 µA and that for sample (b) being about 60 µA. As shown here, the threshold value is reduced by about one half in a thin film synthesized in an atmosphere of an extremely low methane gas concentration of 0.025% as opposed to a diamond thin film synthesized in an atmosphere of a methane gas concentration of 0.5%.

Since a diamond semiconductor synthesized in an atmosphere of methane gas to be of high quality sufficient to emit ultraviolet light at room temperature is used as the diamond semiconductor having a nonlinear light-emitting intensity characteristic, the level of high quality can be controlled by the methane gas concentration. Therefore, the threshold value of the nonlinear optical characteristic can be made low according to the methane gas concentration, thus facilitating even more efficient emission of ultraviolet light.

The measurement results in FIG. 3 indicate that there is some kind of amplification effect to the extent the electron-and-hole pairs generated by the irradiated electron beam generate excitons and that this amplification effect becomes stronger as the strength of the irradiated electron beam increases. If this result is actually specific to a diamond semiconductor, then it will be offered as the fundamental principle in fabricating ultraviolet light-emitting devices, including lasers, from a diamond semiconductor. Therefore, using FIG. 4 and FIG. 5, we will clarify that the measurement results in FIG. 3 are specific to the diamond thin film of this invention. In the same manner as in FIG. 3, the measurement results in FIG. 4 and FIG. 5 were obtained using the aforementioned cathode luminescence measurement apparatus. That is, the measurements were performed by holding the test sample at a temperature of 300 K and with an electron beam acceleration voltage of 30 kV.

Figure 4:
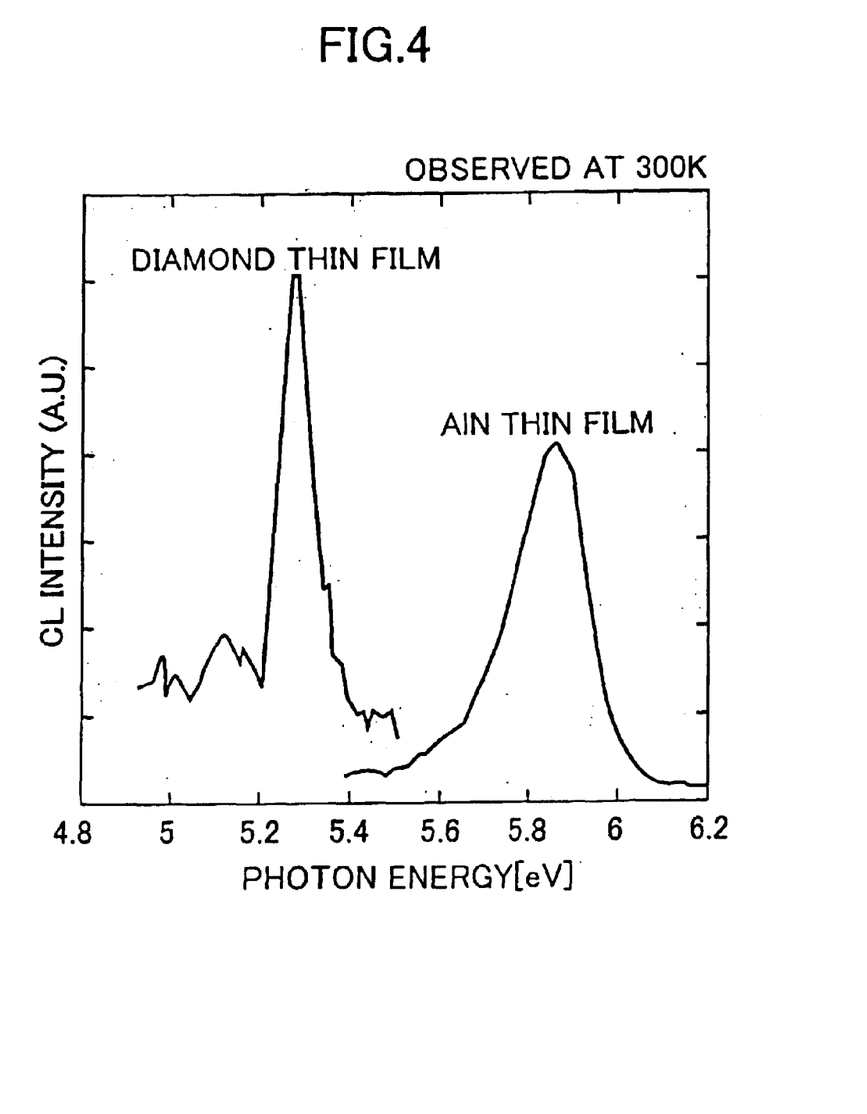
FIG. 4 is a graph showing the results of measurements of each band-edge spectrum of a diamond thin film and an aluminum nitride (AlN) thin film.

FIG. 4 is a graph showing the results of measurement of each band-edge spectrum of a diamond thin film and an aluminum nitride (AlN) thin film. In the figure, the horizontal axis stands for the photon energy and the vertical axis for the CL intensity. The AlN thin film is a wide band gap semiconductor having a direct transition band gap of 5.9 eV at room temperature, and light-emitting peaks were observed at 5.28 eV and 5.85 eV for the diamond thin film and AlN thin film, respectively. The relative light-emitting intensity is substantially the same.

Figure 5:
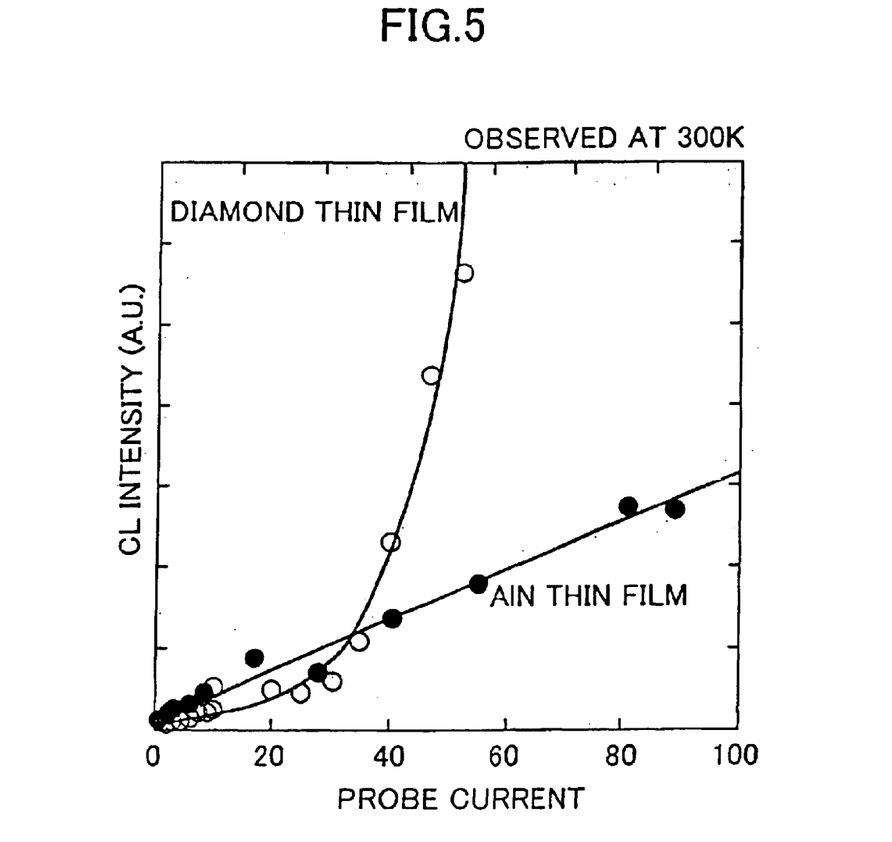
FIG. 5 is a graph showing the relationship between the probe current of the excitation electron beam and the light-emission intensity for the diamond thin film and AlN thin film observed in FIG. 4.

FIG. 5 is a graph showing the relationship between the probe current of the excitation electron beam and the light-emission intensity for the diamond thin film and AlN thin film observed in FIG. 4. In the diamond thin film, the light-emitting intensity increased exponentially in relation to the probe current increase, and in the AlN thin film, it increased proportionally and the nonlinear relationship to the probe current increase that was observed in the diamond thin film was not observed.

The reason why the light-emission intensity from the AlN thin film is greater than that from the diamond thin-film at a probe current below the threshold value is likely because the light-emission process in the AlN thin film is a direct exciton recombination due to the direct transition. Therefore, the difference in light emission intensity is related to the light-emission efficiency resulting from direct transition and indirect transition, and thus there is no contradiction. The light-emission intensities at probe currents above the threshold value, however, are reversed. This indicates that in the diamond thin film the mechanism of light emission changes from the low excitation strength range to the high excitation strength range at the threshold value.

From these results, we can see that the behavior of the exciton light-emission intensity observed in the diamond thin film, which increases exponentially in relation to the increase in the probe current, is manifested by the light-emission mechanism derived from the physical characteristics of diamond itself. Moreover, the behavior of the exciton light-emission intensity, which increases exponentially, contributes greatly to the realization of an ultraviolet light-emitting device in which diamond thin film is used.

The exciton light emission due to electron beam injection in a thin-film diamond semiconductor was explained above, but light-emitting devices utilizing diamond semiconductor are explained below using FIG. 6 to FIG. 11.

Figure 6:
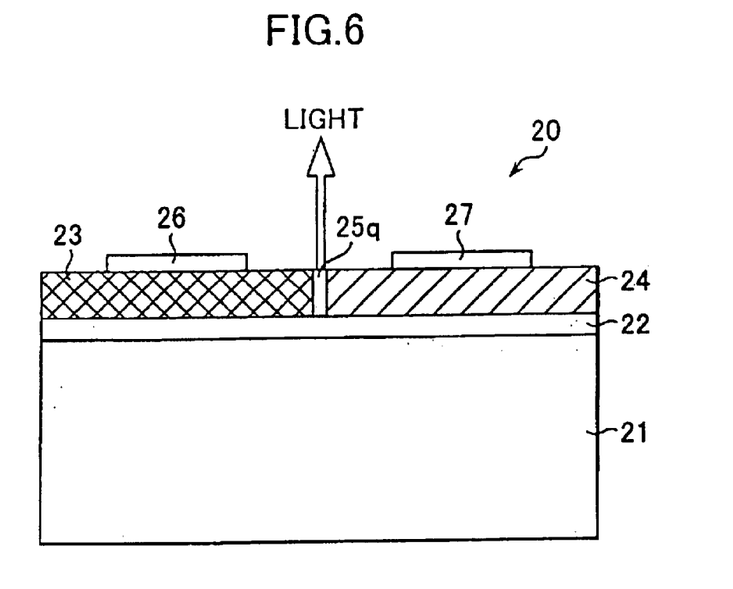
FIG. 6 is a sketch showing the first embodiment of the diamond semiconductor light-emitting device of this invention.

FIG. 6 shows the first embodiment of the diamond semiconductor light-emitting device of this invention. In FIG. 6, the diamond semiconductor light-emitting device 20 of this embodiment comprises an n-type diamond semiconductor layer 23, a p-type diamond semiconductor layer 24, and a high-quality undoped diamond semiconductor layer 25q sandwiched between the n-type diamond semiconductor layer 23 and the P-type diamond semiconductor layer 24. The three layers are formed on a high-quality flat diamond layer 22 formed on a substrate 21. Also, ohmic-contact electrodes 26, 27 made from Ti are formed on the n-type diamond semiconductor layer 23 and p-type diamond semiconductor layer 24, respectively. By means of these electrodes 26 and 27, current flows through the electrode 27, p-type diamond semiconductor layer 24, undoped diamond semiconductor layer 25q, n-type diamond semiconductor layer 23, and electrode 26 in that order.

The aforementioned n-type diamond semiconductor layer 23 and p-type diamond semiconductor layer 24 can each be formed by doping with an impurity under a gas phase during vapor phase synthesis using a CVD method or by ion injection of an impurity into undoped diamond thin-film layers.

When current is injected to the electrode 27 in the diamond semiconductor light-emitting device 20 in this embodiment, holes are injected from the p side to the n side and electrons are injected from the n side to the p side by the injected current. Consequently, the high quality undoped diamond thin-film layer 25q disposed between the p and n sides becomes a region with a high concentration of electrons and holes, resulting in the manifestation of exciton light emission and the output of ultraviolet light from the undoped diamond thin-film layer 25q.

Figure 7:
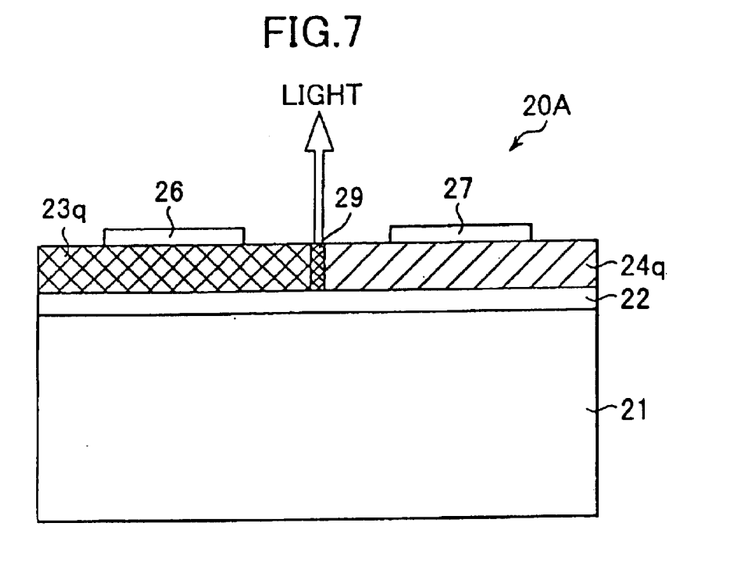
FIG. 7 is a sketch showing the second embodiment of the diamond semiconductor light-emitting device of this invention.

FIG. 7 shows the second embodiment of the diamond semiconductor light-emitting device of this invention. The difference between the diamond semiconductor light-emitting device 20A of this embodiment and that 20 in the first embodiment described above is that both an n-type diamond semiconductor layer 23q and a p-type diamond semiconductor layer 24q in this embodiment are of high quality and in contact, with an activation region 29 formed in the interface between the two layers 23q and 24q. As in the first embodiment described above, when current is injected to the electrode 27 in the diamond semiconductor light-emitting device 20A of this embodiment, holes are injected from the p side to the n side and electrons are injected from the n side to the p side. Further, the activation region 29 between the p and n sides becomes a region with a high concentration of electrons and holes, resulting in the manifestation of exciton light emission and the output of ultraviolet light from the activation region 29.

Figure 8:
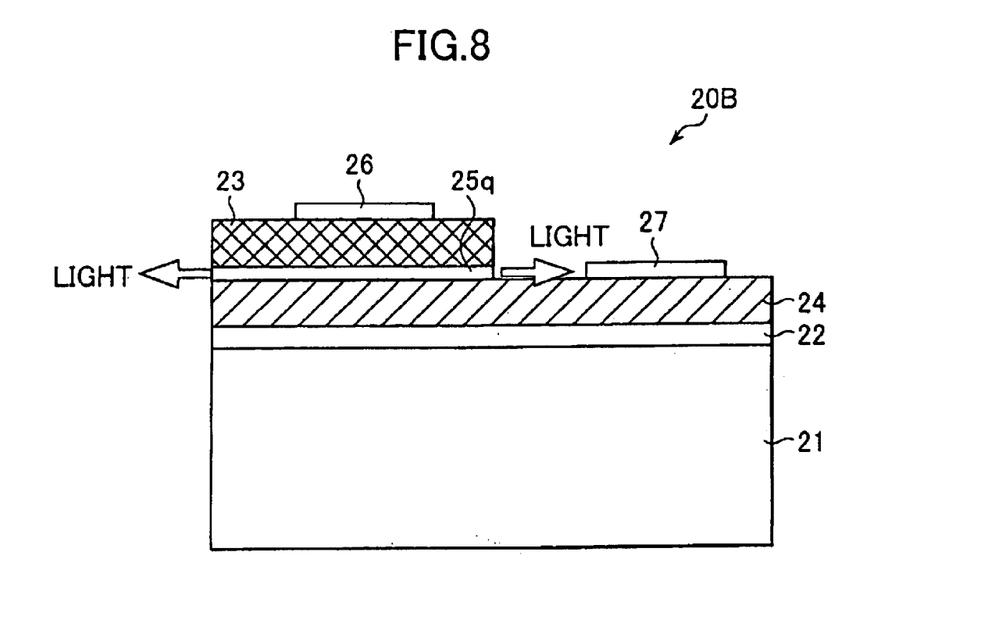
FIG. 8 is a sketch showing the third embodiment of the diamond semiconductor light-emitting device of this invention.

The third embodiment of the diamond semiconductor light-emitting device of this invention is shown in FIG. 8. In FIG. 8, the diamond semiconductor light-emitting device 20B of this embodiment comprises a p-type diamond semiconductor layer 24, a high-quality undoped diamond semiconductor layer 25q formed on top of that, and an n-type diamond semiconductor layer 23 formed on top of that. The three layers are formed by deposition on top of the substrate 21 and flat diamond layer 22. As in the first and second embodiments described above, ohmic-contact electrodes 26, 27 made from Ti are disposed on the n-type diamond semiconductor layer 23 and the p-type diamond semiconductor layer 24, respectively. By means of these electrodes 26, 27, current flows through the electrode 27, p-type diamond semiconductor layer 24, undoped diamond semiconductor layer 25q, n-type diamond semiconductor layer 23, the electrode 26 in that order.

The diamond semiconductor light-emitting device 20B of the above embodiment demonstrates the same action as the diamond semiconductor light-emitting devices 20 and 20A described above. That is, when current is injected to the electrode 27 in the diamond semiconductor light-emitting device 20B of this embodiment, the injected current causes holes to be injected from the p side to the n side and electrons to be injected from tie n side to the p side. Also, the high-quality undoped diamond semiconductor layer 25q sandwiched between the p and n sides becomes a region with a high concentration of electrons and holes, resulting in the manifestation of exciton light emission and the output of ultraviolet light from the undoped diamond semiconductor layer 25q.

Figure 9:
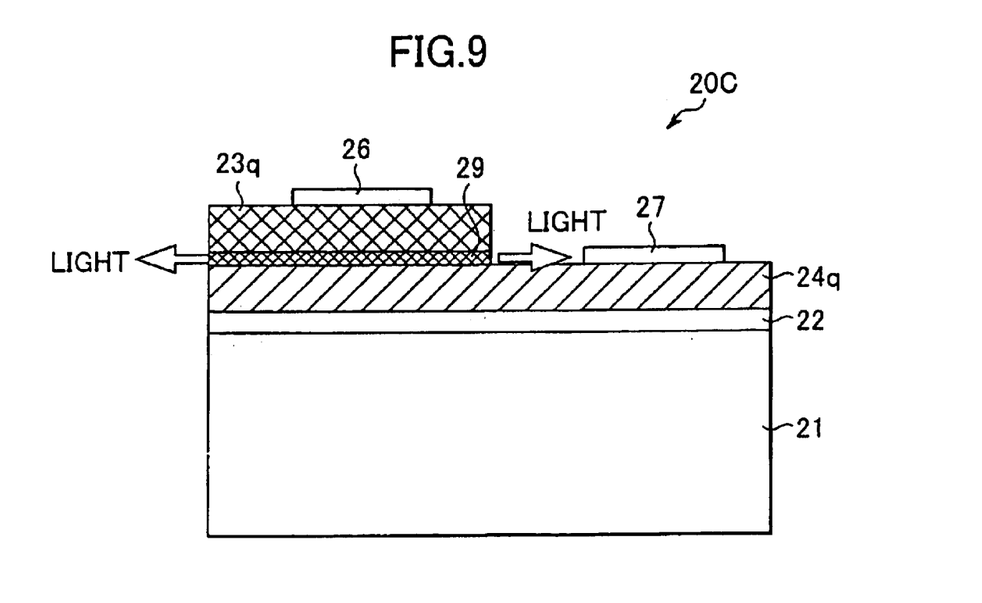
FIG. 9 is a sketch showing the fourth embodiment of the diamond semiconductor light-emitting device of this invention.

FIG. 9 shows the fourth embodiment of the diamond semiconductor light-emitting device of this invention. The difference between the diamond semiconductor light-emitting device 20C of this embodiment and that 20B in the third embodiment described above is that both an n-type diamond semiconductor layer 23q and a p-type diamond semiconductor layer 24q are of high quality and in contact, with an activation region 29 formed in the interface between the two layers 23q and 24q. In the same manner as in the third embodiment described above, when current is injected to the electrode 27 in the diamond semiconductor light-emitting device 20C of this embodiment, the injected current causes holes to be injected from the p side to the n side and electrons to be injected from the n side to the p side. Further, the activation region 29 between the p and n sides becomes a region with a high concentration of electrons and positive holes, resulting in the manifestation of exciton light emission and output from the activation region 29.

Figure 10:
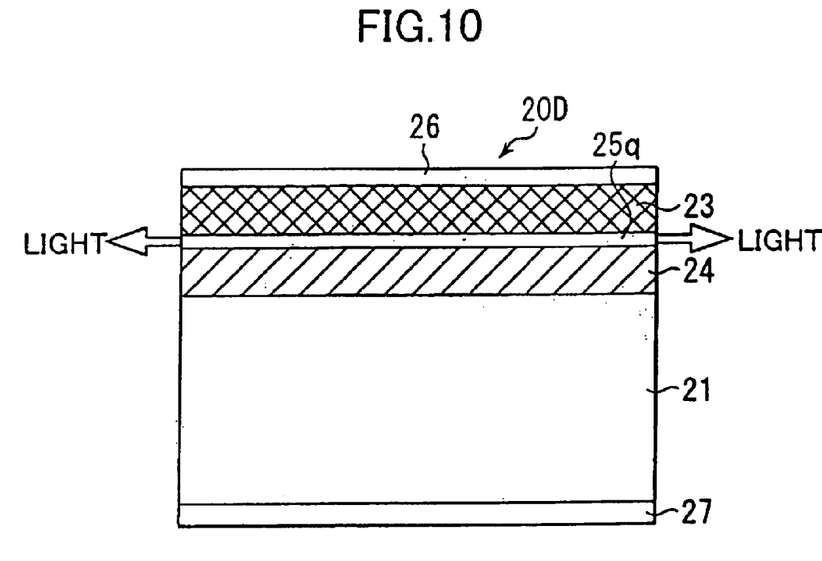
FIG. 10 is a sketch showing the fifth embodiment of the diamond semiconductor light-emitting device of this invention.

The fifth embodiment of the diamond semiconductor light-emitting device of this invention is shown in FIG. 10. In FIG. 10, the diamond semiconductor light-emitting device 20D of this embodiment comprises a p-type diamond semiconductor layer 24, a high-quality undoped diamond semiconductor layer 25q, and an n-type diamond semiconductor layer 23, all of which are formed on top of the substrate 21. Ohmic-contact electrodes 26, 27 made from Ti are disposed on the n-type diamond semiconductor layer 23 and the bottom side of the substrate 21, respectively. By means of these electrodes 26 and 27, current flows through the electrode 27, substrate 21, p-type diamond semiconductor layer 24, undoped diamond semiconductor layer 25q, n-type diamond semiconductor layer 23, and electrode 26 in that order.

The diamond semiconductor light-emitting device 20D of the above embodiment demonstrates the same action as the diamond semiconductor light-emitting devices 20, 20A, 20B and 20C described above. That is, when current is injected to the electrode 27 in the diamond semiconductor light-emitting device 20D of this embodiment, the injected current causes holes to be injected from the p side to the n side and electrons to be injected from the n side to the p side. Also, the high-quality undoped diamond semiconductor layer 25q sandwiched between the p and n sides becomes a region with a high concentration of electrons and holes, resulting in the manifestation of exciton light emission and the output of ultraviolet light from the undoped diamond semiconductor layer 25q.

Figure 11:
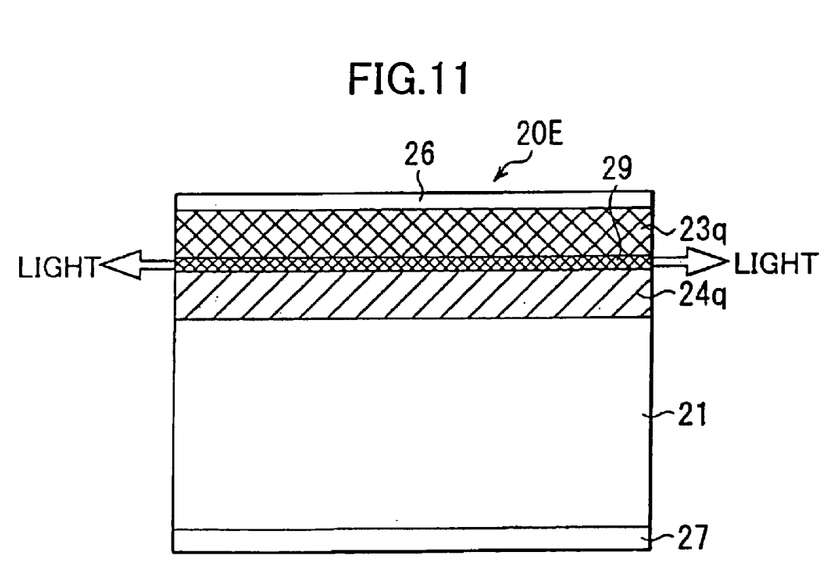
FIG. 11 is a sketch showing the sixth embodiment of the diamond semiconductor light-emitting device of this invention.

FIG. 11 shows the sixth embodiment of the diamond semiconductor light-emitting device of this invention. In FIG. 11, the difference between the diamond semiconductor light-emitting device 20E of this embodiment and that 20D in the fifth embodiment described above is that both an n-type diamond semiconductor layer 23q and a p-type diamond semiconductor layer 24q are of high quality in contact, with an activation region 29 formed in the interface between the two layers 23q and 24q. As in the fifth embodiment described above, when current is injected to the electrode 27 in the diamond semiconductor light-emitting device 20E of this embodiment, the injected current causes holes to be injected from the p side to the n side and electrons to be injected from the n side to the p side. Further, the activation region 29 between the p and n sides becomes a region with a high concentration of electrons and holes, resulting in the manifestation of exciton light emission and the output of ultraviolet light from the activation region 29.

All the diamond semiconductor light-emitting devices 20, 20A, 20B, 20C, 20D and 20E in the embodiments described above emit ultraviolet light as described above. In the first, third and fifth embodiments, the undoped diamond semiconductor layer 2q is of high-quality, and in the second, fourth and sixth embodiments, the n-type and p-type diamond semiconductor layers 23q and 24q are of high-quality. Therefore, due to the existence of a high-quality region, the intensity of the ultraviolet light increases nonlinearly and exponentially, thus facilitating the configuration of extremely efficient light-emitting devices.

One likely reason for being able to achieve nonlinearity with excitons in diamond thin film is because an environment (high-quality thin film) can be achieved in which excitons can exist stably to a very high concentration in the diamond thin film. This is presumed to be due to the reduced defect concentration in the diamond thin-film crystal, the annihilation of excited carriers due to the high purity, the reduced ratio of exitons recombined by the non-light-emitting process, and the extended life of excitons generated in the crystal. As a result, a specific phenomenon based on the high-density exciton state or some unknown phenomenon is being manifested.

Further, by reflecting the ultraviolet light output from the undoped diamond semiconductor layer $25q$ or activation region 29 off a mirror surface in each of the light-emitting devices described above to form a resonator that performs laser oscillation, an extremely efficient light-emitting device can be realized.

In the first, third and fifth embodiments described above, only the undoped diamond semiconductor layer $25q$ was of high-quality, but either one or both of the n-type diamond semiconductor layer 23 or the p-type diamond semiconductor layer 24 can be of high-quality. Inversely, when the undoped diamond semiconductor layer is of ordinary quality, the n-type and p-type diamond semiconductor layers can be of high-quality.

As described above, in the embodiments of this invention, the thin-film diamond semiconductor has an exciton light-emission intensity characteristic that varies nonlinearly. Therefore, ultraviolet light can be emitted extremely efficiently, whereby it is possible to utilize diamond as an ultraviolet light emitting material, thus leading to the actual realization of light-emitting devices and laser devices.

Since a diamond semiconductor synthesized in an atmosphere of methane gas to be of high quality sufficient to emit ultraviolet light at room temperature is used as the diamond semiconductor having a nonlinear light-emitting intensity characteristic, the level of high quality can be controlled by the methane gas concentration. Therefore, the threshold value of the nonlinear optical characteristic can be made low according to the methane gas concentration, thus facilitating even more efficient emission of ultraviolet light.

Further, when configuring a light-emitting device using this thin-film diamond semiconductor, the diamond semiconductor light-emitting device can be made an extremely efficient light-emitting device due to the nonlinear optical characteristic of each diamond semiconductor.

Since this invention is configured as described above, the effects explained below can be achieved.

In this invention, the diamond semiconductor has an exciton light-emission intensity characteristic that varies nonlinearly, and therefore it is possible to emit ultraviolet light extremely efficiently, thus making it possible to effectively utilize diamond as an ultraviolet light-emitting material and actually realize a light-emitting device or laser device.

Furthermore, the diamond semiconductor of this invention uses a diamond semiconductor of high quality sufficient to emit ultraviolet light at room temperature with energy injection. Therefore, the threshold of the nonlinear optical characteristic can be made low depending on the level of high quality, thus making it possible to emit ultraviolet light with even greater efficiency.

The diamond semiconductor light-emitting device of this invention uses a high-quality undoped diamond semiconductor layer between the n-type and p-type diamond semiconductor layers, and therefore the intensity of the ultraviolet light increases nonlinearly and exponentially as the current is increased, thus facilitating the configuration of an extremely efficient light-emitting device.

Moreover, since both the n-type and the p-type diamond semiconductor layers in this invention are of high-quality and also since the n-type diamond semiconductor layer and p-type diamond semiconductor layer are formed in contact with each other, an activation region is formed between the two. Therefore, the intensity of the ultraviolet light also increases nonlinearly and exponentially as the current is increased, thus facilitating the configuration of an extremely efficient light-emitting device.

What is claimed is:

1. A diamond semiconductor light-emitting device comprising:

an n-type diamond semiconductor layer;

a p-type diamond semiconductor layer formed while maintaining a predetermined interval between it and said n-type diamond semiconductor layer; and a high-quality undoped diamond semiconductor layer sandwiched between said n-type diamond semiconductor layer and said p-type diamond semiconductor layer and fabricated using a raw gas including a methane gas and a hydrogen gas in a microwave plasma chemical vapor deposition method, in which the methane gas has a concentration of not more than 2.0%, wherein an exciton light emission that varies nonlinearly according to a current value is output from said undoped diamond semiconductor layer when current is injected to respective electrodes formed on said n-type and p-type diamond semiconductor layers.

2. The diamond semiconductor light-emitting device according to claim 1, wherein said n-type and p-type diamond semiconductor layers are each formed by doping with an impurity under a gas phase during gas phase synthesis using a CVD method.

3. A diamond semiconductor light-emitting device comprising:

a high-quality n-type diamond semiconductor layer fabricated using a raw gas including a methane gas and a hydrogen gas in a microwave plasma chemical vapor deposition method, in which the methane gas has a concentration of not more than 2.0%;

a high-quality p-type diamond semiconductor layer formed in contact with said n-type diamond semiconductor layer and fabricated using a raw gas including a methane gas and a hydrogen gas in a microwave plasma chemical vapor deposition method, in which the methane gas has a concentration of not more than 2.0%; and an activation region layer formed in an interface between said n-type diamond semiconductor layer and said p-type diamond semiconductor layer, wherein an exciton light emission that varies nonlinearly according to a current value is output from the activation region layer when current is injected to respective electrodes formed on said n-type and p-type diamond semiconductor layers.

4. The diamond semiconductor light-emitting device according to claim 3, wherein said n-type and p-type diamond semiconductor layers are each formed with a high-quality undoped diamond semiconductor layer and by ion injection of an impurity in said undoped diamond semiconductor layer.

* * * * *